Sept. 25, 1951 W. J. O'BRIEN 2,569,426

RADIO RECEIVER

Filed July 16, 1945 3 Sheets-Sheet 1

Inventor:
William J. O'Brien
By Williams, Bradbury & Hinkle
attorneys.

Inventor:
William J. O'Brien
By Williams, Bradbury & Hinkle
Attorneys.

Sept. 25, 1951 W. J. O'BRIEN 2,569,426

RADIO RECEIVER

Filed July 16, 1945 3 Sheets-Sheet 3

Inventor:
William J. O'Brien
By Williams, Bradbury & Hinkle
Attorneys.

Patented Sept. 25, 1951

2,569,426

UNITED STATES PATENT OFFICE 2,569,426

RADIO RECEIVER

William J. O'Brien, London, England, assignor, by mesne assignments, to Signal Tuned Radio Corporation, Chicago, Ill., a corporation of Illinois Application July 16, 1945, Serial No. 605,397

44 Claims. (Cl. 250—20)

The present invention relates to the radio and other electrical apparatus and particularly the tuning of radio receivers in response to radio signals such as the modulated or unmodulated carrier signals transmitted by radio stations.

Receivers equipped with this type of tuning are often referred to as stop-on carrier or signal-seeking receivers and hereafter the first of these two terms will be used as a convenient designation of the general type of apparatus.

One of the primary objects of the present invention is to provide a new and improved stop-on carrier apparatus enabling tuning to be accomplished accurately and utilizing both the intermediate and audio frequency amplifiers usually found in radio receivers.

Another and more specific object of the present invention is to provide a new and improved stop-on carrier radio receiver utilizing the intermediate and audio frequency amplifiers of the receiver and wherein the tuning is facilitated by the insertion of additional amplification between the intermediate and audio frequency amplifiers during tuning.

Another and more specific object of the present invention is to provide a radio receiver of the character mentioned wherein selectivity increasing means are also inserted between the intermediate and audio frequency amplifiers of the radio receiver.

Another of the primary objects of the present invention is to provide a new and improved stop-on carrier radio receiver wherein the audio amplifier is utilized both during tuning and reception and wherein the characteristics of the first stage of this amplifier are altered during tuning in order to improve the tuning and, furthermore, to diminish its responsiveness to static and other undesired signals and disturbances.

Another object of the present invention is to provide a new and improved stop-on carrier receiver employing the audio amplifier for tuning purposes and having tuning control means controlled through the audio amplifier, and to provide new and improved tuning signal supply and changeover means for connecting the audio amplifier to the tuning control means during tuning.

Another and further object of the present invention is to provide a new and improved stop-on-carrier control of the character aforesaid, wherein the operating characteristics of the audio amplifier are changed to provide different types of operation during tuning and reception; more specifically wherein said amplifier is coupled conductively and indirectly for tuning and reception, respectively, and wherein an amplifier tube is biased at least to cut off during tuning to provide a trigger type control means.

Another object of the present invention is to provide new and improved stop-on-carrier radio receivers, particularly characterized by novel relay means controlled through the receiver and controlling the tuning of the receiver.

A further object of the present invention is to provide apparatus of the character aforesaid wherein the relay means is energized from a relatively large power source for the purpose of moving a movable member to an operated position wherein it is latched by magnetic flux, and wherein unlatching is effected in response to the position of tuning means by means opposing the flux and preferably in response to a single control impulse.

Another object of the present invention is to provide stop-on-carrier control apparatus wherein a conventional high vacuum electron tube is utilized as a trigger device.

Another object of the present invention is to provide a new and improved relay which is particularly suited for controlling the tuning of a radio receiver.

Another object of the present invention is to provide a new and improved clutch and associated control for use in stop-on-carrier radio receivers.

A further object of the present invention is to provide a new and improved stop-on-carrier radio receiver having novel means for producing opposing control voltages which conjointly control the tuning.

Other objects and advantages of the present invention will become apparent from the ensuing description, in the course of which reference is had to the accompanying drawings in which:

Fig. 1 diagrammatically illustrates one embodiment of the present invention;

Figure 1:
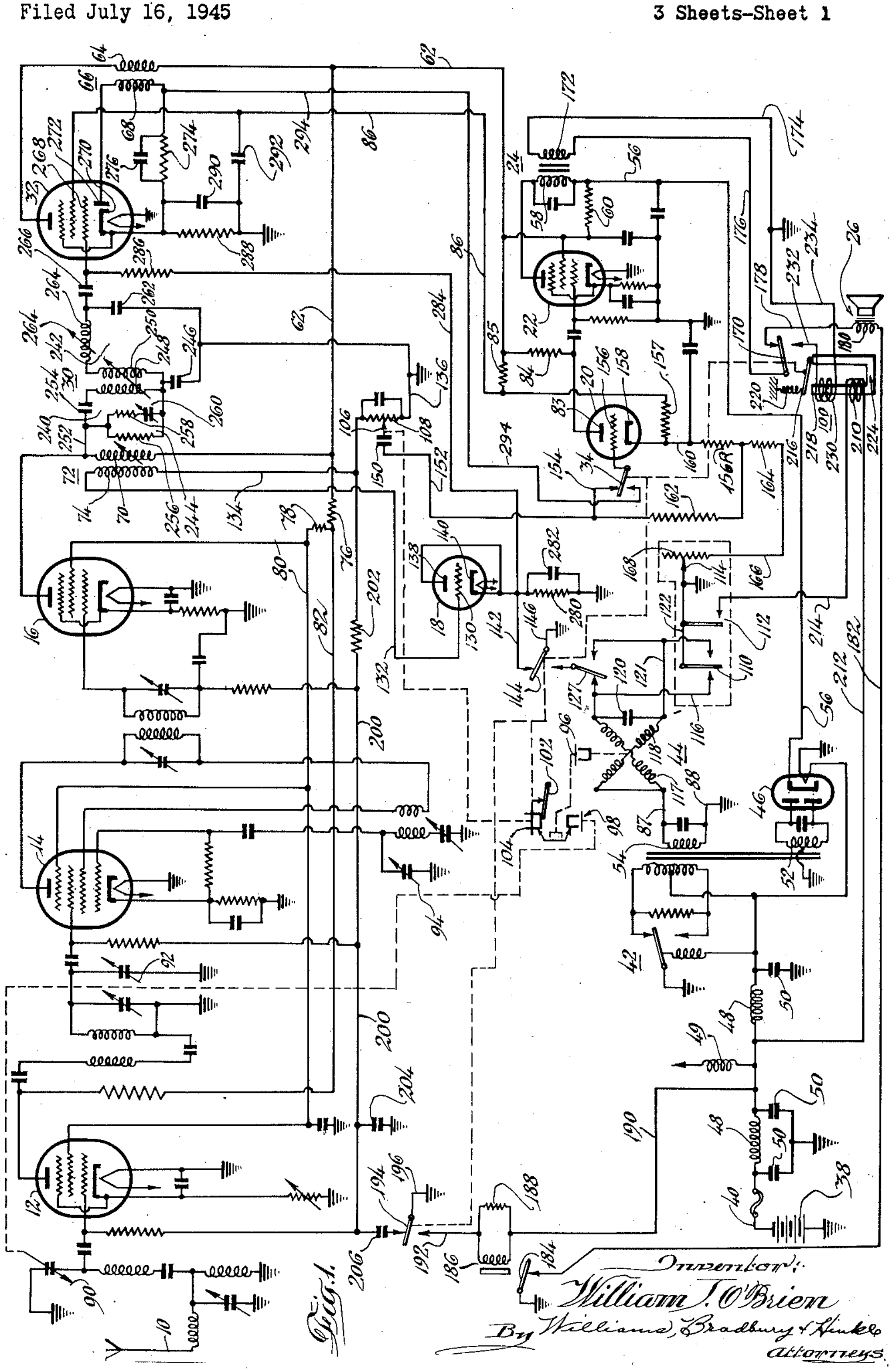

The present invention is illustrated as embodied in a superheterodyne receiver, but it should be understood that it is applicable to other types of radio receivers and that many of the features are applicable not only to radio receivers but to other types of radio and electrical apparatus. The radio receiver illustrated in the drawings comprises an aerial 10, a radio frequency amplifier tube 12 (which may be of the 7A7 type), a first detector and oscillator tube 14 (which may be a 7B8 tube), and intermediate frequency amplifier tube 16 (which may be a 7A7 tube), a second detector and first stage audio amplifier tube illustrated as including the two tubes 18 and 20, of which the first is used as a second detector and the second as a first stage audio amplifier (but which may actually be a twin triode 7F7 tube), a second stage audio amplifier tube 22 (which may be a 7C5 tube) coupled through an output transformer 24 to a loud speaker 26.

All of the foregoing main elements of the radio receivers are utilized both for reception and for tuning the radio receiver to signals received through the aerial 10 from sources which may be radio stations. When the receiver is being tuned, added amplification and selectivity are given to the circuit and the characteristics of the first stage of audio amplification are changed to provide strong, accurate and consistent stop-on-carrier operation. While it is contemplated that any of the foregoing may be accomplished by various means, it has been found desirable to increase the selectivity by a circuit 30 which will be described hereinafter and which for convenience may be called a balanced bridge circuit (of a general character disclosed and claimed in my copending application Serial No. 387,907, filed April 10, 1941, now Patent No. 2,426,580 dated August 26, 1947) inserted between the intermediate and audio frequency amplifiers. The amplification is increased by a tube 32 (which may be a 7E7 tube) coupled to the balanced bridge circuit and thus likewise inserted between the intermediate and audio frequency amplifiers. The change in characteristics of the first stage of audio amplification, i. e., of tube 20, is effected by a switch 34 normally occupying one position (in which it is indicated) during reception and another position during tuning. Before proceeding further with the description of the details of the foregoing primary means of the present invention, it is believed desirable to describe in some detail the other parts of the radio receiver in order that a better understanding may be had of the invention as a whole.

Energy for the apparatus is adapted to be supplied from some suitable source, such as a conventional automobile battery 38 through a direct current supply conductor 40 supplying a plurality of means (to be described shortly) with low voltage direct current and also a vibrator type power plate supply, indicated as a whole by reference character 42 and which may be of conventional construction except for an additional secondary winding supplying alternating current to a reversible alternating current motor 44 utilized to move the tuning condensers. Alternating current voltage is also supplied to a rectifier 46 which may be a tube of the 6X5 type, and which is utilized to supply plate voltage to the various tubes. Other types of motor energizing circuits may be used and the particular one illustrated, wherein an alternating current motor is operated from the vibrator power supply system of the radio receiver, forms no part of the present invention.

In order to eliminate disturbances in the direct current power supply, the latter is connected to the vibrator through filter devices including the two series connected choke coils 48 and the three condensers 50 connecting the terminals of the choke coils to ground.

When the apparatus is in operation, the vibrator induces an alternating current voltage across the secondary windings 52 and 54 which are connected respectively to the rectifier tube 46 and motor 44.

Plate voltage to the various tubes is supplied by the rectifier 46. The output of the rectifier is led through conductor 56, to the plate of tube 22 through the primary winding 58 of output transformer 24. It is led to the plates of the other tubes through circuits including resistor 60 and conductor 62. The conductor 62 is connected to the screen grid of tube 22 and to the plates of tubes 16 and 32 through primary windings 64 of transformer 66 and 70 of transformer 72, respectively. The transformers 66 and 72 have associated therewith secondary windings 68 and 74, to which reference will be had hereafter. The screen grids of tubes 12, 14 and 16 are supplied with appropriate voltage through the conductor 62 and resistors 76 and 78 and conductor 80. The plates of tubes 12 and 14 are supplied through a circuit including the resistor 76 and conductor 82.

Plate 83 of tube 20 is supplied with plate voltage from conductor 62 through resistor 84. The screen grid of tube 32 is supplied with voltage from conductor 62 through resistor 85 and conductor 86. The filament heaters of the various tubes are supplied with low voltage direct current through choke 49, the latter of which is connected to the junction of the two previously referred to choke coils 48.

The motor 44 is, as already indicated, supplied with power from the vibrator through the secondary winding 54. One terminal of the winding is connected by conductor 87 to the motor windings and the other is connected to ground through conductor 88. The motor may be of any suitable alternating current reversible type so that it may move, i. e., rotate, the tuning condensers in opposite directions. The radio receiver of the illustrated type, in common with many superheterodyne receivers, has three of these tuning condensers, indicated by the reference characters 90, 92 and 94 which are ganged together for simultaneous operation.

When the stop-on carrier tuning is operating, the condensers are rotated by the motor 44. As diagrammatically illustrated in Fig. 1, and as will be described in greater detail hereinafter in connection with Figs. 2 and 3, the motor is adapted to be connected to the condensers through a pair of clutches 96 and 98 when the motor is energized to tune in stations. Both of these clutches are normally disengaged and both are engaged when the receiver is being tuned by the stop-on carrier control. The clutch 96 is associated with the motor shaft and is of the type which is engaged when the motor is energized and as a result of the energization. The clutch 98, however, is operated by the stop-on carrier relay 100 which will be described in greater particularity hereinafter. The clutch is operable by a relay operated arm 102 so arranged relative to the relay that when the relay is de-energized, as it is during reception, the clutch is disengaged. When the relay is energized, as it is during tuning, the arm 102 moves to the other of its two positions to engage clutch 98 whereby the motor shaft is operatively connected to the condensers and will rotate the condensers until the stop-on carrier relay is de-energized.

It might be well to state at this point that clutch 96 is provided, in addition to clutch 98, so that the motor inertia will not drive the volume control when the stop-on-carrier relay is de-energized. As will appear shortly, the volume control clutch is also operated by the relay and this clutch is normally engaged, i. e., it is engaged when the tuning clutch 98 is disengaged. Thus, the inter-position of the clutch 96 in the drive from the motor prevents the motor inertia from driving the volume control when the change-over is effected from tuning drive to volume control drive. The clutch also prevents overdrive of the volume control by the motor inertia upon termination of a volume changing operation.

The motor is utilized also to control the volume of the radio receiver. The arrangement is such that during reception the volume control means is connected to the motor and the tuning condenser drive is disconnected, i. e., the operation of the volume control can only be effected when the tuning condensers are stopped and disconnected from the motor. The motor shaft is adapted to be connected to drive the tuning control condensers through the previously referred to clutch 98 operable together with clutch 104 by the stop-on carrier relay operated arm 102. The clutch 104 is operatively connected to the movable member 106 of the volume control resistor 108 which will be described in greater detail shortly.

The radio receiver is provided with remote control means, one of which is a remote volume control 110, a second of which is a control 112, operable to initiate operation of the stop-on carrier tuning control means, and the third of which, 114, is utilized to control the sensitivity of the stop-on carrier control, i. e., to adjust the response so as to select only stations from which a signal above a certain intensity level is obtained. The volume control 110 comprises a switch operable to opposite positions to operate the motor 44 in opposite directions. When the switch is moved in one direction to engage conductor 116 the motor windings 117 and 118 and condenser 120 are connected across the secondary winding 54 to operate the motor in one direction and when the switch is moved in the opposite direction to engage conductor 121, the windings and condenser are connected to operate the motor in the opposite direction. In one direction of rotation of the motor, the condenser 120 is in series with winding 117 and in the other, it is in series with winding 118. In both cases the connection across the transformer winding is effected through the switch 110 and a grounded conductor 122. When the motor is energized and with the receiver conditioned for reception, the volume control means is thus operable in opposite directions through the two clutches 96 and 104, as already indicated.

In the instant embodiment of the invention, the tuning means is so constructed and arranged that tuning can be automatically effected when the tuning means are rotated in opposite directions. To accomplish this, a limit switch 127 is provided to condition the motor for rotation in opposite directions under the control of the stop-on carrier relay 100. In the indicated position of the switch, the two windings are energized—winding 118 being in series with condenser 120, to effect rotation of the motor and of the tuning condensers in one direction. In the other position of the switch, the windings of the motor are again energized—this time the winding 117 being in series with condenser 120, for rotation of the motor and tuning condensers in the opposite direction.

When the radio receiver is conditioned for reception it operates in the conventional manner to receive and to reproduce the received signals in the loud speaker 26. The tubes 12, 14 and 16 operate in the conventional manner and the tube 18 (which it may be remembered once again is a portion of tube 20 but which may be a separate tube) acts as a detector and a source of automatic gain control voltage. The grid 130 of the tube, which is used as a diode plate, is coupled by conductor 132 to one terminal of the secondary winding 74 of the intermediate frequency transformer 72. The other terminal of the transformer winding is connected by conductor 134 to the volume control resistor 108, the opposite end of which is connected to ground by conductor 136. The plate 138 of the tube is connected directly to the cathode 140 and the cathode is preferably connected to ground during reception, this connection to ground being effected through conductor 142, switch blade 144, and ground connection 146. Thus, during normal reception, the full voltage of received signals appear across the volume control resistor 108 from whence they are supplied to the first stage audio amplifier tube. During reception the tube 20 operates as an alternating current amplifier and thus, in the conventional manner, the detector output is supplied to it through a coupling condenser 150, a conductor 152, branch conductor 154, and the previously referred to stop-on carrier relay operated switch 34 in its uppermost position which is connected to the grid 156 of tube 20. In this position of the switch the tube 20 is biased to act as an alternating current amplifier, i. e., to act in the conventional manner, the grid bias being supplied by the voltage drop across a resistor 156R in the cathode circuit and connected to the positive supply conductor 86 by bleeder resistor 157. The terminal end of the resistor is connected to the cathode 158 by conductor 160 while the other end of the resistor is connected to the grid through branch conductor 154 and a grid leak resistor 162. This other end of the resistor is likewise connected to ground through resistor 164, conductor 166, and the sensitivity control member 114 and a resistor 168 associated therewith. It may be noted thus that the voltage drop across resistors 164 and 168 is not utilized to provide grid bias during reception but as will be pointed out shortly, it is utilized during tuning.

During reception, the loud speaker 26 is connected to the output of the final amplifier tube by a further switch blade 170 also operated by the stop-on carrier relay 100. The switch blade serves to connect the loud speaker to the secondary winding 172 of the output transformer 24 through a circuit including a ground conductor 174, the secondary winding 172, conductor 176, switch blade 170 in its uppermost position, conductor 178, the voice coil 180 of the loud speaker, conductor 182, and a grounded switch blade 184 operable by a relay 186.

The switch 184 mutes the loud speaker during the tuning operation and to prevent undesirable noises resulting from switch operation following the tuning in of a station, the relay is arranged to close the switch with a brief time delay. Thus the loud speaker is not actually connected to the receiver until all switch operations have been completed. The time delay in release of switch 184 to its normally closed position is supplied by resistor 188 connected across the relay winding. The relay is energized from the low voltage battery supply source through a conductor 190 and the circuit is so arranged that the relay is initially energized during tuning through a circuit includng conductors 192, a stop-on carrier relay operated switch 194, and ground conductor 196.

In order to enhance the tuning of desired signals and to discriminate against undesired signals, the receiver is provided with what may conveniently be termed "fast" and "slow" automatic gain controls. The "slow" gain control is that conventionally found in radio receivers and, while the "fast" is a gain control means, it provides a modified signal in which the difference between maximum and minimum modulated carrier signals is reduced. This fast automatic gain control during tuning has some very remarkable advantges, as set forth in Patent No. 2,326,737, granted August 17, 1943, to Edward F. Andrews.

The automatic gain control is obtained from the output of the detector tube 18 and more particularly from the drop across resistor 108. The grids of the radio frequency and intermediate frequency tubes are connected to the junction of the resistor 108 and transformer winding 74 through a conductor 200 and resistor 202. The slow automatic volume or gain control effective during reception obtains when both of condensers 204 and 206 are connected across the conductor 200 and ground. The fast automatic volume control obtaining during the tuning operation results from the disconnection of condenser 206 from the automatic gain control conductor 200 and leaving only condenser 204 connected to the conductor. The changeover between the two types of automatic gain control is effected upon the operation of the stop-on carrier relay 100 and more particularly through use of the switch 194, which, in its indicated uppermost position, connects the condenser 206 to ground through conductor 196. The stop-on carrier relay 100 which effects the various changeovers and operates the various switches, heretofore referred to, to condition the receiver for reception or tuning, as the case may be, is also of a novel construction and it is controlled in a novel manner.

When the audio frequency amplifier of the receiver normally used for reception is also used to amplify the stop-on-carrier signal, the relay 100 is used to perform certain circuit controlling and changing functions. To provide a sharp, accurate, stop-on-carrier signal, additional selectivity and gain are provided, for instance, by the balanced bridge circuit 30 and the tube 32, which function only during the tuning operation. The input of the audio amplifier is therefore connected to amplify the output signal from the tube 32 during tuning. The relay 100 also reconnects the input of the audio amplifier to the output of the second detector through the volume control 106 and the blocking condenser 150 during normal reception. In addition, the characteristics of the first audio tube and the coupling thereto are preferably altered when this tube is used for tuning. This changeover or switching function is performed by contacts operated by the relay 100, as will be more fully described.

The switching of the output connections of the audio amplifier from the speaker, to which it is connected during normal reception, to the tripping circuit of the relay 100 and back again are also effected by the contacts of this relay. To operate these various contacts requires some power and it is desirable not to derive this power directly from the stop-on-carrier signal, especially when a gas tube, which by ionization provides large plate energy with a very small change of grid voltage, is not employed.

To meet these requirements, the relay 100 is energized from the battery by means of a manually controlled switch 112. The operation of this switch conditions the receiver for tuning, initiates the tuning operation, and charges resilient or spring biasing means which furnishes the power to recondition the set for reception of the next station to be tuned. The stop-on-carrier signal need only provide sufficient power to trip or trigger the relay 100, thus releasing the power stored in the spring by the battery to supply the energy to re-connect the input of the audio amplifier to the second detector and the output to the speaker when the next signal is tuned in by the movement of the variable reactances which tune the receiver.

The change of connections to the first audio tube, preferably conductively connects the grid of this tube to the stop-on-carrier signal output from the tube 32, and at the same time, biases the first audio tube 20 to cut-off. When so biased, and connected, it is responsive only to signals of positive polarity and acts together with the second audio tube to provide an operating threshold, the value of which can be adjusted up or down by adjusting the grid bias of the tube 20 by means of the sensitivity control 114. Thus the threshold bias is established at the tube 20 so that the operation point is relatively independent of the exact trip characteristics of the relay 100. As soon as this threshold is exceeded by the positive signal from the tube 32, the tube 20 draws plate current and passes a signal which is amplified by the second audio tube 22, thus passing a sharp strong impulse through the transformer 24 to trigger the relay 100, even with a very small positive signal applied to the grid of the tube 20. It will thus be seen that the two audio tubes, when so employed, provide an action similar to that of a gas tube, but without the relatively high cost of a gas tube. Moreover, this is done by the employment of tubes normally required in the set for other purposes. It will thus be seen that excellent operation is secured with substantially no other cost than the switching means, the tube 32 and the transformer 30 being the main elements added solely for the purpose of tuning.

Referring now to Fig. 1, it may be noted that the relay 100 is of the normally non-operated type and that it is non-operated when the receiver is conditioned for reception. In order to render the tuning means operative to tune in another station, the relay is closed and preferably by electrical power obtained directly from the battery. The relay is adapted to be closed by a first winding 210, the energizing circuit for which is completed through the control switch 112 (which will hereinafter be called a start switch for convenience). The energizing circuit includes a conductor 212 connecting one terminal of the winding to the junction of choke coils 48 and a conductor 214 connecting the other terminal of the winding to the start switch 112 which when closed connects the last mentioned conductor to ground through the previously referred to conductor 122.

When winding 210 is energized, the relay armature 216 is attracted toward and into engagement with the relay core 218. The armature is operatively connected to the various switches as diagrammatically illustrated in Fig. 1 with the result that the various switches are operated from their indicated positions to their other positions.

The battery power is utilized also to store power in biasing means, such as a spring 220 biasing the armature to its indicated position away from the core. If desired, the spring 220 may be dispensed with and the resiliency of resilient switch blades be utilized as is the case with the actual relay illustrated in Figs. 2 and 3 and as will be described shortly. The relay includes also ferromagnetic frame 224 (such as steel or iron) completing the flux path.

When the relay is operated, it is held in its operated position after the deenergization of winding 210 by what may broadly be called latching means. This means is preferably of the magnetic type and is specifically due to the remanence of the substantially closed magnetic circuit including the frame, armature and the core 218 which may be made of material which may constitute a permanent or semi-permanent magnet. For instance, the core may be made of moderately hardened 1% chrome steel. Thus, once the armature 216 engages the core, it is retained there by the residual magnetism of the core.

The relay is released in response to the tuning in of a signal by a tripping impulse supplied from the audio output of the receiver to a trip coil 230 also wound about the relay core 218 in a direction to oppose the residual flux. In view of the fact that the tripping impulse need overcome or buck out only part of the residual flux of core 218, which is opposed by the force of spring 220, the energy of the impulse need not be unduly great. It may be mentioned that the relay 100 will be tripped regardless of the polarity with which the trip coil 230 is connected to the secondary 172. However, more sensitivity and better operation is secured with one polarity than with the other and it is preferred to employ the connection providing the greatest sensitivity. It is believed that the polarity should be such that the flux produced by the trip coil bucks out the residual flux when the control or signal voltage applied to the grid of tube 20 is becoming more positive.

It may also be mentioned that the tripping action due to the opposite energization of the trip coil is fast and reliable in action and free from any mechanical friction which might be associated with a mechanical latch.

Under normal reception conditions the circuit for the trip coil 230 is broken by the switch blade 170 operated by the relay. During the tuning operation the trip coil is connected to the secondary winding 172 of the audio output transformer 24 through conductors 174, 176, the switch blade 170 in its lowermost position, conductor 232 leading from the switch to one terminal of the trip coil and conductor 234 connecting the other terminal of the coil to ground.

Detailed attention will now be given to what may be considered another main feature of the present invention, this being the supplying of the desired control impulse or stop-on-carrier signal to the trip coil when a radio signal has been tuned in. It is desirable for obvious reasons that the signal be tuned in accurately and that the relay not be operated in response to undesired electrical disturbances or static. Furthermore, it is desirable that a minimum of apparatus be utilized in order to cut down complications and the cost of manufacture.

In the embodiment of the invention illustrated, a control impulse sufficient to enable the trip coil to trip the stop-on-carrier relay 100 is produced by the joint action of two control impulses, one of which may be considered to be a restraining control voltage and the other an actuating voltage. It is preferred that the restraining control voltage be a negative voltage and the actuating voltage a positive control voltage, and that these two be of such character that the positive voltage exceeds the negative voltage only when a desired signal is closely and accurately tuned in, at which time the negative voltage falls rapidly to a minimum which preferably is low while the positive voltage rises to a maximum value.

The two control voltages are obtained from the output of the intermediate frequency amplifier tube 16, amplified and their joint effect utilized to provide a resultant impulse energizing the stop-on-carrier relay trip coil.

The negative or restraining voltage is obtained through the balanced bridge circuit 30 which preferably but not necessarily is of the character described and claimed in my copending application Serial No. 387,907, filed April 10, 1941, now Patent No. 2,426,580 dated August 26, 1947. This circuit provides a double peaked response curve, the peaks of which are at opposite sides of intermediate frequency and are quite high as compared to the maximum value of the positive actuating voltage at intermediate frequency but which drop into a deep valley or minimum point which may even approach zero at intermediate frequency. The circuit 30 includes primary and secondary tuning circuits 240 and 242 including mutual capacitative and inductive reactances and the primary circuit also includes phasing means 244 so arranged relative to the mutual reactances that the electromagnetic and electrostatic couplings are balanced or neutralized and a resistance component is neutralized by a resistive component supplied by the phasing means 244. The mutual capacitative coupling is supplied by a condenser 246 common to both circuits and the mutual inductive reactance is provided by the adjustable mutual coupling between the coils 248 and 250.

The first tuned circuit 240 is connected to the output of the intermediate frequency amplifier by a conductor 252. In addition to the mutual elements it includes a condenser 254. It also includes the phasing means which consists of a resistor 256 connected in parallel with resistor 258 and an adjustable condenser 260, which are in turn connected across the coil 248 and condenser 254. The second tuned circuit includes, in addition to the mutual elements, a condenser 262 and an inductance coil 264. An adjustable iron core may be included in the coil 70 and the coil 264 for tuning the primary and the secondary respectively to the intermediate frequency. An adjustable iron core may also be included in the coils 248 and 250 which may be wound around the same form for the purpose of varying their mutual inductance so that the inductive coupling may be made equal to the capacitative coupling through condenser 246.

The output of the balanced bridge circuit, i. e., the double peaked control voltage having a steep sided dip at intermediate frequency is supplied to the amplifier section of tube 32 through a coupling condenser 266 connecting the junction of condenser 262 and coil 264 to the grid 268 of tube 32.

The alternating current output of tube 32 is rectified to provide a double peaked direct current control voltage, preferably by a diode portion of tube 32. The rectifier includes the cathode 270 of the tube and a separate anode 272. A resistor 274, across which the negative restraining voltage appears, is connected across the cathode-anode circuit of the diode. The alternating current input to this diode rectifier is supplied through the transformer 66, the secondary of which is connected in series with the resistor 274. A radio frequency bypass condenser 276 is connected across the resistor 274.

The single peaked positive actuating voltage is obtained from the second detector and it is also supplied to the grid of tube 32. In the instant embodiment the positive actuating voltage is obtained as a voltage drop across resistor 280 connected between ground and the cathode 140 of the second detector tube 18. The resistor is shunted by a radio frequency bypass condenser 282. The resistor is short-circuited during normal reception by a circuit including conductors 142 and 146 and the stop-on-carrier relay operated switch 144. During the tuning the circuit is opened and the resistor 280 is effectively in the detector circuit.

As a station is tuned in the detector output increases with the result that the cathode end of resistor 280 becomes more positive. This more positive voltage is applied to the grid 268 of the tube 32 through a circuit including conductor 284 and a series resistor 286. Thus, as a station is tuned in, the grid 268 of the tube 32 becomes more positive to increase the direct current or average plate current flow through the tube 32. This increase in current is utilized to increase the voltage drop across resistor 288 connected between the cathode 270 of tube 32 and ground. The result is that an amplified positive control voltage is obtainable as a result of the voltage drop across resistor 288. Resistor 288 is also shunted by a radio frequency bypass condenser 290. The screen grid is also shunted by a radio frequency bypass condenser 292. It may be noted that a limiting control effect is exerted by the cathode bias of the tube 32 so that it tends to limit its own gain in response to signals of greater strength. When a negative signal is applied to the grid of this tube, it reduces the plate current and therefore reduces the negative self-bias, while, when stronger positive signals are supplied from the cathode 140 of the tube 18, the plate current of the tube 32 increases and thus increases the negative self-bias on its own grid. This has the effect of reducing the difference in output of the tube 32 caused by weak and strong signals. At relatively lower signal levels, the output of the tube 32 increases more rapidly with increasing signal strength, and at higher signal levels the output flattens off and increases only slightly with increasing signal strength. This is desirable for the best operation of the sensitivity control to differentiate between strong and weak stations.

The amplified negative and positive direct current control voltages thus appear as voltage drops across resistors 274 and 288. These resistors are connected in series to provide what may be considered a final control voltage resulting from the algebraic sum of the voltage drops across both resistors. This ultimate control voltage is applied to the input of the audio amplifier and preferably after the first stage of the latter has been converted from an alternating current to a direct current amplifier biased to or below cutoff. In the instant embodiment the ultimate control voltage is applied to the grid 156 of the first stage audio amplifier tube 20 through conductor 294 and switch blade 34 of the stop-on carrier relay when the relay is operated to its tuning position.

As the negative restraining voltage is sharply reduced and the positive actuating voltage is increased as a station is exactly tuned in, it will be seen that the algebraic sum of these two have a positive polarity when a station is correctly tuned, and this positive signal is impressed on the grid of the tube 20, which is biased substantially to or below cut-off. It will be seen that when the grid of the tube 20 is connected to the output of the tube 32 through the lead 294, that the amount of the bias is controlled by the sensitivity control 114 and is produced by current flowing through the bleeder resistor 157 and the resistors 156R, 164, and that part of 168 which is determined by the position of the sensitivity control. If the tube 20 is biased substantially below cut-off, by the proper adjustment of the sensitivity control, only stations which produce a signal of sufficient positive strength to overcome the negative bias and raise the grid of the tube 20 above cut-off will be tuned in, and weaker stations will be passed over. When a station has been tuned in, the grid of the tube 20 is connected to the second detector through the lead 152 and the condenser 150, and its bias is controlled entirely by the resistance drop across the resistor 156R impressed on the grid through the leak resistor 162. The resistor 156R is of such value as to give the tube the necessary small negative bias for proper audio amplification, and the condenser 150 prevents any direct current components of the output of the second detector from being impressed on the grid 156.

It has heretofore been indicated that one of the features of the present invention consisted in the provision of a new and improved relay mechanism. Another feature resides in the correlation of the relay 100 with the previously referred to tuning and volume control clutches and also with the various contacts whereby there is provided a compact control unit operable by a single relay. The control unit of the present invention utilizes the single relay 100 which positively actuates the contacts and clutches and which is not at all delicate or expensive, but, on the contrary, is rugged and inexpensive.

Referring now to Figs. 2 to 6, inclusive, it may be noted that the control unit is indicated as a whole by reference character 300. The unit comprises a pair of supporting plates 302 and 304 secured in spaced apart relation by means including the tubular spacers and their associated securing means 306 to provide room therebetween for the gearing and clutches as will be described shortly.

The motor 44 is suitably secured to the outer side of the mounting plate 304 with the opposite ends of the motor shaft 308 extending through the mounting plate 304 and through the outer end plate 310 of the motor.

Figures 2, 3:
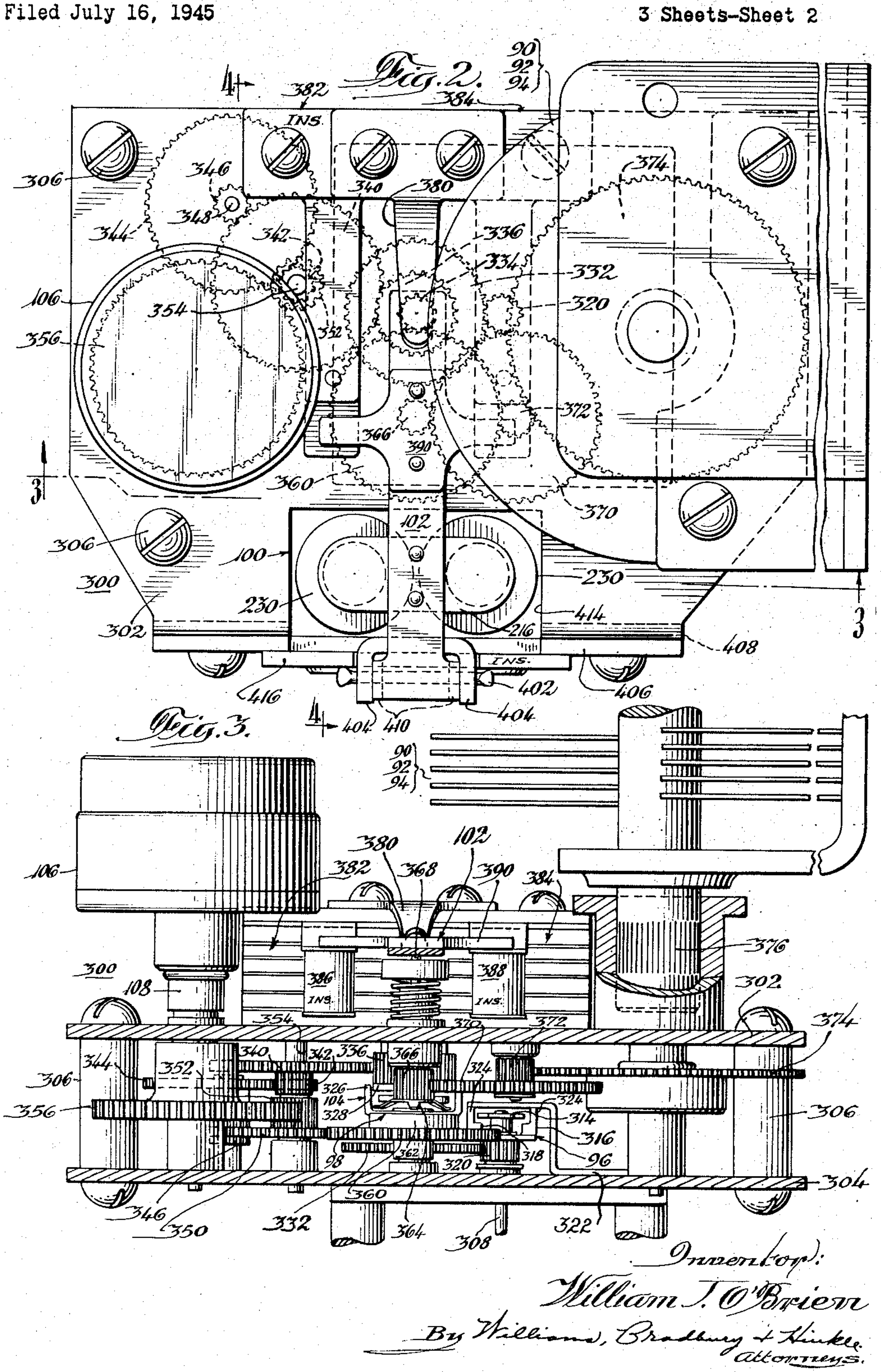
Fig. 2 is a side elevational view of relay means embodied in the arrangement of Fig. 1.
Fig. 3 is a top elevational view of the relay means.
Figures 4, 5, 6:
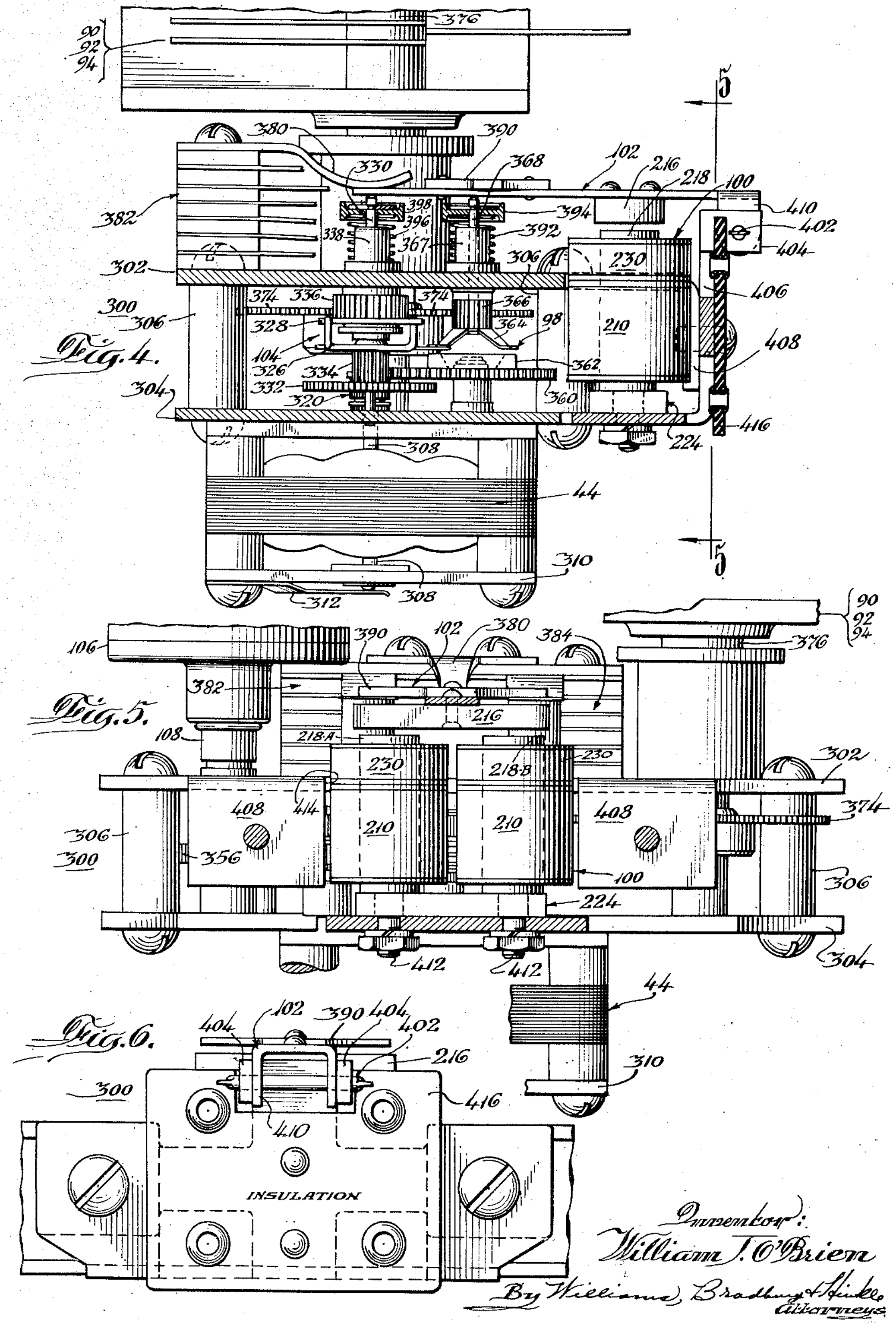
Fig. 4 is a transverse cross sectional view taken along line 4—4 of Fig. 2.
Fig. 5 is a cross sectional view taken along the line 5—5 of Fig. 4.
Fig. 6 is a fragmentary enlarged view of the relay means, the view being taken from the right of Fig. 4.

The motor clutch 96 is normally disengaged by a spring 312 biasing the motor shaft 308 upwardly as indicated in Fig. 4 thereby to disengage the driving and driven clutch elements 314 and 316, respectively (see Fig. 3). The clutch elements may be of suitable construction. For instance, the driving clutch element 314 may be a multi-toothed member fixedly secured to the motor shaft. The driven clutch element 316 includes a pair of teeth 318 cooperatively associated with the member 314.

The clutch is adapted to be engaged upon the energization of the motor 44 and by the resulting axial movement of the rotor against the biasing spring 312. When the motor is energized the rotor is centered magnetically and the driving clutch element 314 is brought into engagement with the driven clutch element 316. The driven clutch member 316 is fixedly secured to a driving pinion 320 and both of these elements are loosely journaled on the motor shaft 308 so that when the clutch is engaged, the pinion 320 is rotated. Both the tuning and volume controls are driven through pinion 320 as will be brought out shortly.

The driven clutch element 316 is restrained against axial movement along shaft 308 by a generally Z-shaped bracket 322 secured to the inner side of mounting plate 304 with one of its parallel portions abutting loosely against a pair of diametrically opposite projections 324 extending axially outward from the clutch teeth 318.

The volume control is driven through the normally engaged volume control clutch 104 which is interposed in a train of gears connecting the pinion 320 with the movable member 108 of the volume control. The clutch includes a driving element 326 (see Fig. 4) and a driven element 328. The driving element may comprise a generally U-shaped element, the parallel arms of which are adapted to engage a pair of diametrically opposite radially extending teeth comprising the driven element 328. The driven clutch element is fixedly secured to a rotatable and axially movable shaft 330 through which the engagement and disengagement of the clutch is effected. The driving clutch element 326 is constructed as a unit with a pair of gears 332 and 334, the former of which is driven by the motor driven pinion 320. Thus when the pinion 320 is rotated by the motor, the gears 332 and 334 and the driving clutch element 326 are all rotated.

The driven clutch element 328 is constructed as a unit with a gear 336, which unit encircles shaft 330 but is mounted for rotation independently of the shaft as upon a sleeve 338 secured to the mounting plate 302. The gear 336 drives a gear 340 (Figs. 2 and 3) rotatable as a unit with a smaller gear 342 driving in turn a larger gear 344 formed as a unit with a smaller gear 346, the last named unit being journaled upon a shaft 348 mounted upon the mounting plate 304. The gear 346 drives a gear 350 formed as a unit with gear 352, which unit is rotatably journaled upon the shaft 354 to which gears 340 and 342 are secured. The gear 352 drives a gear 356 connected to the movable element 108 of the volume control. Thus when the volume control clutch 104 is in its normally engaged position and the motor 44 is energized to engage clutch 96, the volume control may be moved in opposite directions, depending upon the direction of rotation of motor 44 to increase or decrease the reception volume.

The tuning condensers 90, 92 and 94 are driven when the motor is energized and tuning clutches 96 and 98 are engaged and when the volume control clutch 104 is disengaged. The drive extends from the motor driven pinion 320 and through clutch 98 through the following gearing. The pinion 320 drives the previously mentioned gears 332 and 334 and the latter is in mesh at all times with a gear 360 having secured to one side of it the driving clutch member 362. In order that the tuning clutch engage and disengage without undue delay, the driving element is preferably constructed of rubber and formed generally cup-shaped. It is suitably secured as by adhesive or washers to the gear 360 and the resulting unit is mounted for rotation upon a stub shaft secured to the mounting plate 304 (see Figs. 3 and 4). The driven clutch element 364 may take various forms, such as the multi-fingered construction illustrated in the drawings. The clutch element is formed as a unit with a pinion 366, which unit is secured for movement with a rotatable and axially movable shaft 368 extending through the mounting plate 302. It may be seen, therefore, that when the shaft 368 is moved downwardly, the clutch 98 is engaged and pinion 366 driven by the motor. The pinion 366 (Figs. 2 and 3) drives the tuning condensers through gears 370, 372 and 374, the latter of which is connected to the tuning condenser shaft 376 (see Fig. 2). Gears 370 and 372 are constructed as a unit and rotatably mounted upon a stub shaft secured to the mounting plate 302.

From the foregoing description of the driving arrangement and clutches, it may be noted that they are compactly mounted between a pair of spaced apart mounting plates and that the clutches are operable through the axially movable shafts 330 and 368 which extend through and to one side of the mounting plates. Thus, both of the clutches are readily controlled by means of a single relay and this is what is done in accordance with one of the features of the present invention. Not only is the relay utilized to control the clutches but it is also utilized to operate the various movable contacts which have heretofore been referred to and which control the change-over of the receiver from tuning to reception and vice versa.

The tuning and volume control clutches 98 and 104 are alternately engaged and disengaged under the control of the relay 100 and, more specifically, by the lever 102 moved thereby. In the drawings, the lever is illustrated in the position occupied by it during reception, at which time the tuning clutch 98 is disengaged and the volume control clutch is engaged. At this time the lever is at its furthest position away from the relay windings and armature, at which position it is biased by springs associated with the clutches and by the resiliency of the movable contact blades 34, 144, 170 and 194 heretofore referred to in connection with Fig. 1, and which position is determined by a stop arm 380. The stop arm is secured (see Fig. 4) to the outer ends of adjacent banks of switches, indicated by reference characters 382 and 384 (Fig. 3) including the movable contact blades just referred to and stationary blades associated therewith. These two banks of switches are secured to the same side of mounting blade 302 as the clutch control shafts so that the contacts may readily be operated by the same lever 102 controlling the clutches. The movable switch blades are tied together by insulating strips 386 and 388 and the lever arm 102 is located between the two switch banks and a switch operating arm 390 is secured by rivets to the relay lever 102.

The clutch controlling shafts 330 and 368 are aligned with the length of the lever 102 and located below it so that both shafts are moved downwardly when the relay is energized. Both shafts are biased toward the lever by springs. The shaft 368 is biased toward the lever by a spring 392 encircling the stud 367 through which the shaft 368 extends. One end of the spring bears against the stud and the other against a disc 394 secured near the upper end of shaft 368 by suitable means. The shaft 330 is biased toward lever 102 by a spring 396 encircling stud 338 and confined between the stud and a disc 398 secured near the upper end of shaft 330.

The relay lever 102 is pivotally secured for movement about an axis by a supporting pin 402 mounted upon a pair of supporting lugs 404 preferably made integral with an upturned flange 406 of the mounting plate 304. The flange is secured to an oppositely extending flange 408 of the other mounting plate 302 (see Fig. 4). The pivotally mounted end of lever 102 is provided with a pair of lugs 410 through which the pin 402 extends and which engage the inner sides of lugs 404 to provide a good bearing surface to guide the movements of the lever.

The relay windings 210 and 230 are wound about the core 218 which, in order to obtain more efficient operation, is divided into two parts 218A and 218B (see Fig. 5). The cores are secured at their lower end to a frame member 224 made of magnetic material. For convenience, the cores are provided with threaded extensions 412 (also shown in Fig. 5) whereby the cores are effectively secured to the frame base 224 and to the mounting plate 304.

The upper ends of the cores 218 extend above the other plate 302 and are cooperatively associated with the armature 216 which is of a length so as to extend across the tops of the cores and which is secured to the underside of the lever 102. The windings also extend above the plate 302, which is provided with an opening 414 to receive the relay.

In order to decrease the drain on the battery when the relay windings 210 are energized to operate the relay to initiate the tuning operation or to provide more pull or greater efficiency, the clearance between the armature 216 and the core 218 is made quite small as may be best noted from Figs. 4 and 5 and the necessary motion is provided by the length of the lever 102.

The conductors leading to the relay windings 210 and 230 are conveniently led thereto through a conductor support 416 made of insulating material and secured to the flanges 406 and 408 of the mounting plates as best illustrated in Figs. 4 and 6.

In order that a more comprehensive understanding of the invention as a whole may be had, its operation will now be reviewed. Under normal conditions, the receiver is conditioned for reception and, under these conditions, the various switches and the stop-on-carrier relay 100 occupy the positions in which they are indicated in the drawings. Power is supplied from the battery to the vibrator 42, the rectifier 46 and to the filament heaters. The vibrator supplies alternating current to the motor 44 but the latter is deenergized because energizing circuits thereto are not closed at this time. The rectifier supplies high direct current potentials, properly filtered, to the tubes so that they are conditioned for operation.

The receiver circuits are conditioned for reception by the stop-on-carrier relay operated switches. The relay 100 itself is deenergized and it is in its non-operated position. Circuits to both windings 210 and 230 are opened so that no current is consumed by the relay. The relay operated switch 34 connects the audio amplifier to the output of the second detector through condenser 150 and conductors 152 and 154 and supplies the required bias to the first stage audio amplifier tube 20 to condition it for proper amplification of the audio signal supplied it from the second detector. The switch also disconnects the conductor 294 from the grid so that no control voltage is applied to the grid of the tube. The switch 144 renders ineffective the means for producing the positive actuating voltage as it short-circuits the cathode resistor 280 from which this voltage is obtained. The switch also deenergizes the motor 44. The switch 194 connects the condenser 206 across the automatic gain control voltage to provide the requisite "slow" gain control which is necessary for proper reproduction of audio signals. The switch also breaks the circuit to the mute relay 186 so that the switch 184 of the latter connects one terminal of the voice coil of loud speaker 26 to ground. The switch 170 completes the circuit from the audio amplifier output to the loud speaker and also disconnects the stop-on-carrier relay trip winding 230 from the output of the audio amplifier.

The radio receiver is thus conditioned for operation in the usual manner with the radio signals amplified and then rectified by the second detector and the audio output from it supplied to the audio amplifier and then to the loud speaker 26. The source of positive control voltage, resistor 280, is ineffective, i. e. it being shorted out by switch 144, so that the full output of the second detector tube 18 appears across the resistor 108 to provide the automatic volume control voltage and to supply the audio amplifier. The highly selective circuit 30 providing the double peaked restraining voltage is connected to the intermediate frequency amplifier tube 16 and the amplifier tube 32 is supplied with the restraining voltage but even though this portion of the circuit is thus always ready for use, it is not used because conductor 294 is disconnected from the audio amplifier.

In order to tune in another station, it is necessary only to close the manually operable switch 112 forming part of the control unit and it may be placed at some convenient place either in proximity to or remote from the receiver. Immediately the switch is closed, the stop-on-carrier relay 100 is moved to its operated position by power derived from a suitable source, in this case the automobile battery. Thus, the battery supplies the power necessary to disengage the normally engaged volume control clutch 104 to engage the tuning clutch 90 and to move the various contacts, all of which is done by the single lever 102 of the relay. Ordinarily, the switch 112 is kept closed only momentarily so that heating of the relay presents no major problem even though it be designed to furnish ample power to perform the various functions required and to store power in the spring (such as spring 220) to change back to the reception condition by the trip action of the coil 230. If the switch 112 be momentarily closed, the movement of the relay 100 to its operated position immediately changes the receiver circuits from normal reception condition to tuning condition. However, if the switch 112 is kept closed, the automatic tuning does not take place because the winding 210 is kept energized and prevents the relay from returning to its non-operated position. Ordinarily, as already indicated, the switch 112 is closed but momentarily and it is not kept closed unless the listener desires to skip certain stations.

When the stop-on-carrier relay 100 is energized and moved to its operated position, as indicated above, and the switch 112 opened, the relay remains in its operated position because of the latching provided by the residual flux of the cores 218A and 218B which hold the armature 216 thereagainst and thereby retain lever 102 in its operated position.

The movement of the stop-on-carrier relay to its operated position results in the disengagement of the volume control clutch and the substantially simultaneous engagement of the tuning clutch 98. The volume control clutch 104 is disengaged by the downward (as viewed in Fig. 4) movement of the clutch control shaft 330 which moves the driving clutch member 326 axially out of engagement with the driven clutch member 328. The tuning clutch 98 is engaged by the downward movement of clutch control shaft 368 which moves the driven clutch element 364 downwardly into engagement with the rubber driving clutch element 362. Thus, when the motor is energized through closure of switch 144, the tuning condensers are rotated through the now engaged clutch 98 and the motor clutch 96 which is engaged immediately the motor is energized. The clutch 96 is engaged by movement of the motor rotor into alignment with its stator against the force of spring 312 to bring the driving and driven clutch elements 314 and 316 into engagement.

When the receiver is changed over from reception to tuning, a number of changes occur. The first is the insertion of added selectivity and amplification between the high and low frequency amplifiers of the receiver and the change in the operating characteristics of the first audio amplifier tube 20. The added selectivity and amplification insures that the tuning condensers will not be stopped until receiver has been accurately tuned to a station and the change in the characteristics of the tube 20 provide an accurate control operating threshold and also tends to prevent stoppage as a result of disturbing impulses which might otherwise effect operation of the relay 100 and stop the condensers at positions where there is no desired station.

The foregoing changes are effected by relay operated switches 34 and 144. Switch 34 connects the control voltage line 294 to the grid of the tube 20 and changes the grid bias of the tube to or substantially below cut-off by disconnecting the grid from conductor 154 so that resistors 164 and 168 as well as resistor 156R provide negative grid bias. This disconnection from conductor 154 also disconnects the audio amplifier from the second detector output so that only the control voltage is applied to the amplifier. As already indicated, the conductor 294 directly couples the control voltage to the audio amplifier, biased to cut-off and connected as a D. C. amplifier so that undesired impulses will not be likely to cause the tube to pass plate current. As a result of the direct current connection and the bias to cut-off, a positive signal on the grid will cause the tube 20 to draw plate current and pass a signal to trip the relay 100. If the conductor 294 were connected to an alternating current amplifier with a positive bias, any signal including the restraining voltage would cause the passage of plate current for operation of the control, which is not desired. The switch 144 opens the short circuit around resistor 280 so that positive actuating voltages are applied to the grid of amplifier tube 32 and so that the positive and negative actuating and restraining voltages, respectively, will be amplified and applied to the audio amplifier.

The operation of the relay also energizes the motor to operate in a direction determined by the limit switch 127, the energized circuit being completed through the switch 127 and switch 144. The switch 194 disconnects the condenser 206 from the automatic gain control voltage thereby to make this a "fast" gain control voltage and to provide the advantages heretofore set forth. At the same time the mute relay 186 is energized to open switch 184 and disconnect the voice coil of loud speaker 26 from ground. Switch 170 also breaks the speaker circuit, i. e., it disconnects the other terminal of the speaker from the audio output and it connects the trip coils 230 of the stop-on-carrier relay to the audio output of the amplifier.

The tuning condensers are rotated by the motor in a direction determined by the position of switch 127, which, it may be remembered, is a limit switch adapted to reverse the motor at desired limits of movement of the tuning condensers. Should the starting switch 112 be kept closed, the motor will simply alternately run in opposite directions under the control of swich 127 until such time as the switch 112 is opened.

With the switch 112 opened to condition the apparatus for stoppage of the tuning condensers automatically in response to a received radio signal, the motor will continue to rotate the condensers until a signal is accurately tuned in. When the signal is tuned in, the relay 100 is supplied with a tripping impulse to effect the release of the armature so that the relay is returned to its non-operated position by means of the springs which were tensioned during movement into its operated position. This tripping impulse is supplied only when the signal is accurately tuned in and when the signal is not accompanied by too much static or other extraneous interference which will cause the restraining voltage to prevent stoppage.

When the tuning condensers are in positions whereat no signal is received, there is no output from the intermediate frequency amplifier tubes with the result that no control voltage is applied to the grid of the first audio frequency amplifier tube 20 through the control voltage line 294. When the condensers are moved by the motor 44 to tune in a station, a voltage appears at the output of the intermediate frequency amplifier. This voltage has a relatively broad response curve as determined by the radio and intermediate frequency stages of the amplifier. This signal is supplied to the dector 18 by secondary 74 and also to the secondary 250. As the station is tuned in, there thus appears a gradually increasing voltage drop across the resistor 280 from which the positive control voltage is supplied to the amplifier tube 32. At the same time the selective circuit supplies an increasing voltage to the input of amplifier tube 32 which produces a negative restraining voltage across resistor 274 opposing the positive control voltage appearing across cathode resistor 288. When the station is being tuned in, the negative restraining voltage across resistor 274 overcomes the positive actuating voltage across the resistor 288 until the signal is tuned in accurately. When exactly tuned in, the positive actuating voltage is at a maximum, whereas the negative restraining voltage drops suddenly to a very low value, which may be made, if desired, to approach zero.

When the station is thus tuned in, the resultant control voltage applied to the first stage amplifier tube 20 suddenly becomes much more positive, i. e., a positive control impulse is applied to the grid of the tube through the line 294. This control impulse is amplified by the tubes 20 and 22 and supplied to the trip coil 230 of the stop-on-carrier relay through the transformer 24. The relay is thus suddenly unlatched because the flux produced by the trip coil opposes (or bucks out) the residual flux present in the magnetic circuit because of the semi-permanent magnet cores 218 and the substantially closed iron magnetic circuit of relay 100. Thus the energy stored in the contacts and in the clutch springs 392 and 396 immediately returns the lever 102 to its non-operated position to return the various switches to their indicated positions to condition the receiver for reception. The loud speaker, however, is not connected to the output of the audio amplifier until after the lapse of a brief interval because of the time delay closing of switch 184 forming a part of the muting relay 186.

If strong static is present at the time a station is being tuned in, then the negative restraining voltage may exceed the positive actuating voltage because of the wider and higher double peaked response curve of the negative control voltage. It is true that the negative voltage is very low at the intermediate frequency to which the selected circuit is sharply tuned, but it has a high value in excess of the positive actuating voltage at frequencies spaced a short distance from the intermediate frequency.

It has been found in practice that the tuning condensers may be rotated quite rapidly and still preserve good automatic tuning. For example, the motor speed may be about 3,800 R. P. M. when tuning and the gearing may cut down the speed in the ratio of about seven hundred and seventy-five to one so that the condensers may be turned at about five revolutions per minute or once across the broadcast band in about six seconds.

The direct or conductive coupling of the first stage audio amplifier to the control voltage source is preferred. If indirect coupling, as through a condenser, is utilized, the operation would not be as reliable and consistent as it is with direct coupling, because the polarity is not preserved. Also, the amplitude of the impulse would depend on the rate of change of voltage applied to the condenser. With a direct coupling, the rate of change of voltage is not of major importance in the control. The factors which do control are the polarity and absolute value of the control voltage above cutoff. However, since there is inductive or indirect coupling between tubes 20 and 22 and also between the latter and relay 100, the condensers should be turned by the motor at not too low a speed for good operation on unmodulated signals.

The sensitivity of the control, i. e., the selective tuning in of signals of different intensity, is controlled by the sensitivity control 114. This control varies the bias of grid 156 of the first audio amplifier tube. If the sensitivity control is adjusted to make the grid more negative, then signals of greater intensity are required to produce a tripping impulse of sufficient value to release the stop-on-carrier relay.

The volume of the reproducer may be adjusted manually but only during such time as the tuning means are not being operated by the motor. This is because the volume control clutch cannot be engaged when the tuning clutch is engaged. However, when the volume control clutch is engaged, then the motor 44 may be operated in reverse directions by operation of the volume control switch to engage conductor 116 or conductor 121.

While but a single embodiment of the invention has been described in detail, it should be understood that the details thereof are not to be construed as limitative of the invention except in so far as set forth in the accompanying claims.

Having thus described my invention, what I claim as new and desire to secure by Letters Patent of the United States is:

1. In a tunable radio receiver, a high frequency amplifier and a low frequency amplifier utilized for tuning the receiver as well as for normal reception, means energized from the high frequency amplifier for supplying a positive tuning control signal substantially sharper than the response curve of said high frequency amplifier, and means including switch means for connecting said tuning control signal supplying means to said low frequency amplifier to impress said positive tuning signal on the input grid of said low frequency amplifier during tuning and for disconnecting it therefrom during reception.

2. In a radio receiver, high and low frequency amplifiers utilized for tuning the receiver as well as for normal reception, high selectivity means adapted to be energized from the high frequency amplifier for supplying restraining voltage which is a minimum at a predetermined frequency, second means adapted to be energized from the high frequency amplifier for supplying an actuating voltage which is a maximum at said frequency, means supplied with said voltages for producing a control voltage which is the resultant of said restraining and actuating voltages, and means including switch means for connecting said tuning control voltage supplying means to said low frequency amplifier during tuning and disconnecting it therefrom during normal reception.

3. In a radio receiver, high and low frequency amplifiers utilized for tuning the receiver as well as for normal reception, tuning control voltage supplying means energized from said high frequency amplifier, including sharp frequency discriminating means, additional grid controlled amplifying means, and means for controlling the gain of the additional amplifying means in response to variation in the strength of received signals being tuned in, and means including switch means for connecting said tuning control voltage supplying means to said low frequency amplifier during tuning and disconnecting it therefrom during normal reception.

4. In a radio receiver, tuning means, a radio frequency amplifier, an audio frequency amplifier, a sound reproducer, control voltage supplying means energized from said radio frequency amplifier including additional amplifying means controlling the receiver tuning means, and means including switch means normally inter-connecting the radio and audio frequency amplifiers to the reproducer and operable to couple said control voltage supplying means to the input of the audio amplifier and said receiver tuning control means to the output of the audio amplifier during tuning.

5. In a tunable radio receiver, high and audio frequency amplifiers, means including a grid controlled amplifier tube energized from the high frequency amplifier having a cathode resistor and a connection therefrom for supplying a control voltage which has a maximum positive value when a signal is tuned to resonance, and means including switch means for supplying said positive control voltage to the audio frequency amplifier only during tuning.

6. A radio receiver having an audio amplifier tube with a cathode resistor supplying a grid bias of the value required for sound reproduction during normal reception, means energized from a circuit of the receiver for supplying a tuning control voltage, switch means for coupling said voltage supply means to the grid of said amplifier tube during tuning and uncoupling it therefrom during normal reception, means including resistance means connecting said switch means to the cathode resistor, and means for changing said grid bias on the amplifier tube to a different value for tuning, said switch means making said bias changing means ineffective during normal reception and effective to change said bias during tuning.

7. A radio receiver including a detector, an audio amplifier normally coupled to said detector and having a grid bias of a value required for sound reproduction during normal reception, means energized from a circuit of the receiver for supplying a control voltage which has a positive maximum value at a predetermined frequency, means for disconnecting the amplifier from said detector and conductively coupling the control voltage supplying means to the amplifier, and means for biasing said amplifier substantially to cut-off when the control voltage is supplied thereto.

8. A radio device including a grid controlled amplifier tube utilized for two different functions, each requiring a different grid bias, single pole, double-throw switch means, means connecting the grid of said amplifier to a switching member, self-biasing resistance means connected to the cathode of said amplifier tube, a resistor connected between said cathode resistance means and one pole of said switch means, a signal source for one of said functions connected to the same pole, a signal source for the other function connected to the other switch pole, and connecting means for making more of said cathode resistance means effective to bias the grid of said amplifier tube more negatively when said switching member is in contact with said other switch pole.

9. In a radio receiver, an audio amplifier, reproducing means, relay controlled tuning means operated through said amplifier, switch means controlling the tuning and reproducing circuits, including the audio amplifier input circuit, for changing over from tuning to listening, means for muting the reproducing circuits during tuning, and time delay means for maintaining said muting means effective a short interval after the tuning operation has been completed and after the switch means has been operated to condition the audio amplifier input circuit for listening.

10. In a radio receiver, variable tuning means, a relay for controlling the tuning means, means for energizing said relay to operate it to one position, magnetic flux means for holding said relay in said one position, and means operable in response to a change of current resulting from variation of said tuning means for counteracting said flux with a flux of opposite polarity produced by such change of current to effect release of the relay.

11. In a radio receiver an audio amplifier, tuning means, relay means controlled from the receiver for controlling the tuning means, means for operating said relay means from a non-operated to an operated position to initiate the tuning operation, means including the residual magnetism of the relay means for latching said relay means in its operated position, and residual magnetism reducing means coupled to the output of said audio amplifier for releasing said relay means for return to its non-operated position.

12. In a radio receiver, tuning means, a source of power, a power drive means, means including relay means controlled in response to the position of the tuning means and relay operated means controlling the drive of the tuning means by the power drive means for controlling the tuning means, means including a first winding forming part of the relay means and means for connecting said winding to the power source for operating the relay means from a non-operated to an operated position, thereby to render the power drive means effective to drive the tuning means, power storing means energized upon movement of said relay from its non-operated to its operated position for returning the relay means to its non-operated position, means including the residual magnetism of the magnetic circuit of said relay means for latching said relay means in its operated position, and latch releasing means including a second relay winding energizable in response to the position of the tuning means and opposing the residual magnetism for releasing said relay means for return to its non-operated position by said power storing means, thereby to terminate drive of the tuning means.

13. A relay, including in combination, core means of relatively impermanent ferromagnetic material, armature means also of impermanent ferromagnetic material movably mounted with respect to the core and adapted to move operable means between two positions, said armature means being adapted when in operated position to form a substantially closed magnetic circuit with the core means and said magnetic circuit being relatively impermanent but retaining after magnetization a considerable residual magnetic flux as long as the circuit remains closed whereby it is latched in operated position, a first coil surrounding the core means and adapted selectively to be energized to move said armature means into its operated position, biasing means associated with the armature tending to move it into its non-operated position and in which power is stored when the armature moves to its operated position, and means including a second coil surrounding said core means for producing a magnetic impulse opposing the residual flux in said relatively impermanent material and magnetically unlatching the armature, whereby the armature is returned to its non-operated position by power stored in the biasing means when said first coil is energized.

14. In a radio receiver, variable tuning means, a relay controlling said tuning means, means biasing said relay to a first position, direct current means for energizing said relay to operate it to a second position, residual flux means for holding said relay in said second position, and means energized from the receiver adapted to supply said relay with a said signal for bucking said residual flux to effect release of said relay, whereby said relay is returned to said first position by said biasing means.

15. In a tunable radio receiver, an inductively coupled low frequency amplifier utilized for tuning the receiver as well as for normal reception, tuning control voltage supplying means energized from said receiver, means including switch means normally connecting said audio amplifier for reception of audible signals, relay means normally disconnected from the audio amplifier by said switch means, means for operating said relay means from non-operated to operated position to operate said switch means for connecting said tuning control voltage supplying means to said audio amplifier and for connecting said relay means to said audio amplifier, means for latching said relay means in its operated position, and latch releasing means operable by an alternating current surge through said inductively coupled audio amplifier resulting from the tuning in of a signal, and fast acting means for returning the relay to non-operated position when unlatched.

16. In a radio receiver, variable tuning means, means for controlling the tuning means, magnetic relay means controlling said tuning means controlling means and having an operated position wherein said tuning means is operative to effect tuning and a non-operated position wherein the tuning operation is terminated, two coils associated therewith, direct current means for energizing one of said coils to latch said relay means in operated position, means for supplying an impulse from said receiver to said second coil for unlatching said relay means permitting return thereof to non-operated position to terminate the tuning operation.

17. In a radio receiver, tuning means, amplifying means, an electron tube energized from the amplifying means and having a plurality of electrodes including a cathode, a cathode resistor through which the space current of the tube passes, sharp frequency discriminating means coupled to and energized by the amplifying means, an amplifier tube having a grid, plate, and cathode, a diode plate having a cathode connected to last mentioned cathode, means coupling said sharp frequency discriminating means and the cathode of said electron tube to said grid, means coupling the plate circuit of said amplifier tube to said diode plate, a resistor between said diode plate and the cathode of the amplifier tube, a resistor in series with the cathode of the amplifier tube through which the space current of that tube flows, and means for utilizing the algebraic sum of the voltages across the diode resistor and last mentioned cathode resistor to control the tuning means.

18. In a radio receiver, variable tuning means, control means for the tuning means, a low frequency output transformer having a secondary winding, and a primary winding coupled to said receiver, a loud speaker, a relay associated with said tuning control means biased to one position, latching means for holding said relay in another position, relay latch releasing means, and a switch and electric conductors operated by said relay for alternately connecting the loud speaker and said latch-releasing means to the secondary winding of said output transformer during audible signal reception and during tuning respectively.

19. In a radio receiver, variable tuning means, an audio amplifier, a reproducer, a relay biased to one position, latching means for holding said relay in another position, latch releasing means, and a switch and conductors for coupling said latch releasing means to said audio amplifier during tuning and for connecting said sound reproducer to said audio amplifier when said latch releasing means releases said relay.

20. In a radio receiver, a power source, volume control means, tuning control means, an electric motor, means including gearing and clutch means for connecting the motor to the tuning control means, means including gearing and second clutch means for connecting the motor to the volume control means, a relay having a movable member and means biasing the movable member to a nonoperated position, means including a first relay coil and selectively operable means for connecting the coil to the receiver power source for operating the movable member to an operated position, means latching the movable member in said operated position, means providing a signal responsive to the position of the tuning control means, and a second relay coil energized by said signal for tripping said latching means, and means operatively connecting the movable member of the relay means to the tuning and volume control clutch means so that when said first mentioned coil is energized the tuning control means clutch means is engaged and the volume control clutch means is disengaged and when the second mentioned coil is energized the volume control clutch is engaged and the tuning control clutch is disengaged by energy stored in said biasing means by the energization of said first coil.

21. A radio receiver, including a detector, an audio amplifier normally coupled to said detector and biased for sound reproduction, means energized from a circuit of the receiver for supplying a tuning control voltage which has a positive maximum value at a predetermined frequency, a source of bias voltage for said amplifier adapted to bias it substantially to cut-off, and switching means for disconnecting the amplifier from said detector and for conductively coupling it to said tuning control voltage supplying means and also connecting it to said source of bias voltage.

22. In a radio receiver, means for tuning said receiver, relay means controlling said tuning means, a sound reproducer, an audio amplifier supplying amplified signals to said relay means and reproducer, a detector and tuning signal supplying means coupled to said receiver, two position switch means controlled by said relay means for coupling the input of said audio amplifier to said tuning signal supplying means during tuning and to said detector during listening, and means for preventing substantial audible operation of said reproducer for a time sufficient to permit substantial decay of audio amplifier input switching disturbances.

23. In a radio receiver, means for tuning said receiver, relay means controlling said tuning means, a sound reproducer, an audio amplifier supplying amplified signals to said relay means and reproducer, a detector and tuning signal supplying means coupled to said receiver, two position switch means controlled by said relay means for coupling the input of said audio amplifier to said tuning signal supplying means during tuning and to said detector during listening, and means for preventing substantial audible operation of said reproducer for a time sufficient to permit substantial decay of audio amplifier input switching disturbances, said last mentioned means including a time delay relay controlled by said relay means.

24. A radio receiver having variable tuning means, relay means controlling said tuning means having a first position to effect tuning and movable to a second position to terminate the tuning operation, means biasing the relay means to its second position, means magnetically latching said relay means in its first position, means including a first relay winding adapted to be energized for operating said relay means to its first position to initiate tuning, a second relay winding adapted to be energized to release said magnetic latching means, means energized from the receiver for supplying a positive control signal in response to variation of said tuning means, and means including grid controlled means coupled to said signal supplying means and to said second winding for supplying the later with an initial current impulse of such polarity that the magnetic flux produced by said winding opposes the latching flux in response to the application of the positive control signal to the grid of said grid controlled means.

25. A radio receiver having variable tuning means, relay means controlling said tuning means having a first position to effect tuning and movable to a second position to terminate the tuning operation, means biasing the relay means to its second position, means magnetically latching said relay means in its first position, means including a first relay winding adapted to be energized for operating said relay means to its first position to initiate tuning, a second relay winding adapted to be energized to release said magnetic latching means, means energized from the receiver for supplying a positive control signal in response to variation of said tuning means, and means including grid controlled means, having a grid biased to cut-off to which the positive control signal is applied and coupled to said second winding for supplying the latter with an initial current impulse of such polarity that the magnetic flux produced by said winding opposes the latching flux.

26. In a radio receiver having variable tuning means, a carrier frequency amplifier coupled thereto, a detector, a modulation frequency amplifier, additional grid controlled carrier frequency amplifying and selecting means for producing a sharp high peaked voltage characteristic coupled to said carrier frequency amplifier, switching means and circuits controlled by the switching means for selectively coupling the input of the modulation frequency amplifier to the detector during normal reception or to the carrier frequency selecting and amplifying means during tuning.

27. In a tunable radio receiver, a variable tuner, a carrier frequency amplifier, a modulation frequency amplifier coupled thereto and used therewith during the tuning of the receiver as well as during normal reception, relay means spring biased to tuner stopping position controlling said variable tuner and coupled to said modulation frequency amplifier, a tuning control signal bandwidth reducing means energized from the carrier frequency amplifier and including means producing a voltage characteristic narrower than that of the carrier frequency amplifier in response to the reception of a carrier frequency, tuned by said tuner, and switch and circuit means operated by said relay means coupling the tuning control signal bandwidth reducing means to the modulation frequency amplifier during tuning and disconnecting it therefrom during normal reception.

28. In a relay controlled device started by the application of relatively large manually controlled energy and stopped by small automatically controlled energy, stopping means for stopping the operation of said device, a flux-latched relay having a magnetic circuit including an armature operably associated with said stopping means movable to open or close said magnetic circuit, a coil on said relay, resilient means biasing said armature to open position, manually controlled means briefly actuated to move said armature to closed position, charge said resilient means with potential energy, and start operation of said device, means for maintaining a holding flux in said closed magnetic circuit, after termination of the application of said manually controlled energy, in an amount sufficient to maintain closure but insufficient to effect closure of said magnetic circuit, a small power amplifying tube having a grid, and a plate circuit coupled to said coil, means operated automatically during the operation of said device to apply a voltage to said grid and produce a current surge, of smaller energy than said potential energy, in said coil of proper polarity to buck said holding flux and permit the energy stored in said resilient means to open said magnetic circuit and stop the operation of said device.

29. A sensitive release flux latch relay having a magnetic circuit including an armature movable to open or close said magnetic circuit, coil means on said relay, means biasing said armature to open position, means for briefly energizing said coil means to move said armature to closed position and store substantial power in said biasing means, means for maintaining a holding flux of predetermined polarity in said closed magnetic circuit sufficient to maintain but insufficient to effect closure, means effective after cessation of closure energization for supplying smaller electric power to said coil means of proper polarity to buck down said holding flux and release said armature for movement to open position by the greater power stored in said biasing means.

30. An automatic sensitive release flux latched relay comprising a magnetic circuit including a core and an armature movable toward said core to form a substantially closed magnetic circuit, means biasing said armature to open said magnetic circuit, manually controllable means for closing said magnetic circuit and storing substantial power in said biasing means, means for maintaining a holding flux in said magnetic circuit sufficient to hold said circuit closed against the force of said biasing means, operable means movable to one position by said manually controllable closing means and to another position by said biasing means, electric coil means around a portion of said magnetic circuit adapted to be energized by the plate current change of a small electronic amplifier to buck down said holding flux and release said armature permitting said biasing means to open said magnetic circuit and move said operable means to its other position.

31. An automatic sensitive release flux latched relay comprising a magnetic circuit including a core and an armature movable toward said core to form a substantially closed magnetic circuit, means biasing said armature to open said magnetic circuit, manually controllable means for closing said magnetic circuit and maintaining a holding flux in said circuit sufficient to hold said circuit closed against the power stored in said biasing means during closing, operable means movable to one position by said manually controllable means and to another position by said biasing means, electric coil means around a portion of said magnetic circuit adapted to be energized by the plate current change of a small electronic amplifier to buck down said holding flux and release said armature for movement permitting said biasing means to open said magnetic circuit and move said operable means to its other position.

32. A sensitive release flux latch relay having a magnetic circuit and an armature movable to open or close said magnetic circuit, said magnetic circuit also including ferromagnetic material having considerable coercive force, operable means moved between two positions by said armature, a core of ferromagnetic material, an armature of ferromagnetic material movably mounted with respect to the core and adapted to move said operable means between two positions, said armature being adapted when in operated position to form a substantially closed magnetic circuit with the core and said magnetic circuit being relatively impermanent but retaining after magnetization a considerable residual magnetic flux in said magnetic circuit, whereby it is latched in operated position, coil means surrounding said core and adapted selectively to be energized to move said armature into its operated position or to buck down said residual magnetic flux, biasing means associated with the armature tending to move it into its nonoperated position and in which substantial power is stored when the armature moves to its operated position, and means including said coil means for producing a magnetic impulse opposing the residual flux magnetically unlatching the armature and permitting return to its nonoperated position by said power stored in the biasing means.

33. In stop-on-signal radio apparatus, variable tuning means, means for varying said tuning means, means for stopping the variation of said tuning means including a relay having an armature, means biasing said armature to a variation stopping position, manually controllable means for moving said armature against the biasing force to a variation starting position, magnetic flux means for holding said relay in said starting position, and means operable in response to a change of current resulting from variation of said tuning means for counteracting said flux with a flux of opposite polarity produced by such change of current to effect release, and movement of said armature to said variation stopping position by said biasing means.

34. In a radio apparatus having variable tuning means, a relay having an armature biased to one position and held in another position by latching means, means associated with said armature for stopping variation of said tuning means, means responsive to a signal tuned by said tuning means supplying alternating current stopping impulses, means releasing said latching means only in response to a current impulse of a predetermined polarity, and means for connecting said impulse supplying means to said latch releasing means with such polarity that the first impulse releases the latching means and effects stoppage without an intervening nonreleasing polarity impulse.

35. In a radio receiver having variable tuning means, means for varying said tuning means, means for stopping variation of said tuning means including a relay biased to one position and held in another position by latching means, a relay operating electron tube, means operable in response to a signal tuned by said tuning means supplying a control impulse to said tube, a coil on said relay effecting latch release in response to a current impulse of predetermined polarity, an output transformer having a primary connected to said relay tube and a secondary connected to said coil, the polarity of said connections being such that the first impulse releases the latch and effects stoppage.

36. In stop-on-signal radio apparatus, a variable tuner, means for stopping variation of the tuner including a relay responsive to a signal tuned by said tuner, an output transformer having a primary winding coupled to said apparatus and a secondary winding, a coil on said relay connected to said secondary winding, a signal reproducer connected to said secondary winding, a switch having a movable contact engageable with one or the other of two additional contacts, means connecting said movable contact to said secondary, means connecting said coil and said reproducer each to one of the other contacts, means controlled by said relay to move said movable contact into engagement with said coil contact during variation of said tuner and into engagement with said reproducer contact when said relay stops said tuner.

37. In stop-on-signal radio apparatus, a variable tuner, means for stopping variation of the tuner including a relay responsive to a signal tuned by said tuner, a step-down output transformer having a primary winding coupled to said apparatus and a secondary winding, a low impedance signal reproducer connected to said secondary winding, a low impedance coil on said relay connected to said secondary winding, a switch connected to said secondary winding, and means controlled by said relay for causing said switch to complete a low impedance secondary circuit through said coil during tuner variation and through said reproducer when said relay stops said tuner.

38. In stop-on-signal apparatus having a variable tuner, means for stopping said tuner including a relay having a movable armature, means biasing said armature to stopping position, coil means on said relay, manually controllable means for energizing said coil means and moving said armature to starting position, grid controlled electron tube means having a plate output coupled to said coil and a grid input, frequency selective means coupled to said tuner including two resistors and separate rectifying means supplying direct current voltages to each resistor, means connecting the ends of the two resistors having like polarity, means connecting the other ends of said resistors to said grid input, said frequency selective means being so constructed and arranged that the voltage drop across one resistor applying a positive voltage to the grid side of said grid input is substantially greater than the voltage drop across the other resistor applying a negative voltage thereto only when said tuner is closely tuned to a signal thereby effecting a current change in said coil means sufficient to permit relay release and movement of said armature by said biasing means to tuner stopping position.

39. In stop-on-signal apparatus having a variable tuner, means for stopping said tuner including a relay having a movable armature, means biasing said armature to stopping position, coil means on said relay, manually controllable means for energizing said coil means and moving said armature to starting position, grid controlled electron tube means having a plate output coupled to said coil and a grid input, frequency selective means coupled to said tuner including two resistors and separate rectifying means supplying direct current voltages to each resistor, means connecting the positive ends of the two resistors, means connecting the negative ends of said resistors to said grid input, said frequency selective means being so constructed and arranged that the voltage drop across one resistor applying a positive voltage to the grid side of said grid input is substantially greater than the voltage drop across the other resistor applying a negative voltage thereto only when said tuner is closely tuned to a signal thereby effecting a current change in said coil means sufficient to permit relay release and movement of said armature by said biasing means to tuner stopping position.

40. In a radio receiver, a variable tuner, a high frequency amplifier coupled to said tuner, a low frequency amplifier, a reproducer coupled to said low frequency amplifier, a latching relay controlling said tuner and coupled to the low frequency amplifier, manually controlled means for latching said relay to start variation of said tuner, a detecting means coupled to said high frequency amplifier, selectivity increasing means coupled to said high frequency amplifier, and means including switch means positioned by said relay when unlatched to couple said detecting means to said low frequency amplifier and shiftable when said relay is latched to couple said low frequency amplifier to a network including said selectivity increasing means to unlatch said relay in response to a signal tuned by said tuner and reduced in band width by said selectivity increasing means.

41. In a radio receiver, a variable tuner, a high frequency amplifier coupled to said tuner, a low frequency amplifier, a reproducer coupled to said low frequency amplifier, a relay coupled to the low frequency amplifier and having a spring to operate the relay in one direction to stop variation of said tuner, manual means for operating the relay in the opposite direction to charge the spring and start variation of said tuner, a detecting means coupled to said high frequency amplifier, selectivity increasing means coupled to the high frequency amplifier, and means including switch means positioned by said relay when in stopping position to couple said detecting means to said low frequency amplifier and shiftable when said relay is in starting position to couple said low frequency amplifier to a network including said selectivity increasing means so that variation of said tuning means is stopped by said spring when the relay is operated in response to a signal tuned by said tuner and reduced in band width by said selectivity increasing means.

42. In a radio receiver, a variable tuner, control means for said tuner, a high frequency amplifier coupled to said tuner, a low frequency amplifier, a reproducer coupled thereto, detecting means for alternately supplying a detected signal and a positive actuating signal to said low frequency amplifier, relay means operably associated with said control means and responsive to a signal tuned by said tuning means and amplified by said low frequency amplifier, selectivity increasing means including a rectifier supplying a negative restraining voltage associated with said detecting means, and means including switch means operated by said relay means for normally coupling said detecting means to supply a detected signal to said low frequency amplifier and shiftable to couple said rectifier and said detecting means to supply a positive actuating signal reduced in band width by said negative restraining signal to said low frequency amplifier during tuning.

43. In a radio apparatus having variable tuning means, a relay having a coil and an armature biased to one position and held in another position by holding means, means associated with said armature for stopping variation of said tuning means, means responsive to a signal tuned by said tuning means supplying alternating current stopping impulses, means including said relay coil constructed and arranged to release said hoding means only in response to a current impulse of a predetermined polarity, and reactive means passing alternating current and blocking direct current for coupling said impulse supplying means to said coil whereby said armature is released to stop said tuner by a half wave of alternating current of the predetermined polarity.

44. In stop-on-signal radio apparatus, a variable tuner, means for stopping variation of the tuner including a relay responsive to a signal tuned by said tuner, reactive coupling means having input terminals coupled to said apparatus and output terminals, a coil on said relay connected to an output terminal, a signal reproducer connected to an output terminal, a switch having a movable contact engageable with one or the other of two additional contacts, means connecting said movable contact to an output terminal, means connecting said coil and said reproducer each to one of the other contacts, means controlled by said relay to move said movable contact alternatively into engagement with said coil contact or into engagement with said reproducer contact to render the relay operative and the reproducer inoperative during variation of said tuner and to render the relay inoperative and the reproducer operative when the relay effects stoppage of said tuner in response to said tuning signal.

WILLIAM J. O'BRIEN.

REFERENCES CITED

The following references are of record in the file of this patent:

UNITED STATES PATENTS

| Number | Name | Date |
|---|---|---|
| 1,700,282 | Burns et al. | Jan. 29, 1929 |
| 2,063,295 | Braden | Dec. 8, 1936 |
| 2,165,502 | Peterson | July 11, 1939 |
| 2,197,933 | Kirkwood et al. | Apr. 23, 1940 |
| 2,211,750 | Humby et al. | Aug. 20, 1940 |
| 2,262,218 | Andrews | Nov. 11, 1941 |
| 2,341,937 | Maynard | Feb. 15, 1944 |
| 2,343,199 | Moyer | Feb. 29, 1944 |
| 2,369,542 | Dietrich | Feb. 13, 1945 |